United States Patent
Kim

(10) Patent No.: US 7,851,300 B2
(45) Date of Patent: Dec. 14, 2010

(54) METHOD OF FABRICATING A TRENCH GATE MOSFET FOR MAXIMIZING BREAKDOWN VOLTAGE

(75) Inventor: Hee-Dae Kim, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 61 days.

(21) Appl. No.: 12/344,563

(22) Filed: Dec. 28, 2008

(65) Prior Publication Data
US 2009/0166734 A1 Jul. 2, 2009

(30) Foreign Application Priority Data
Dec. 28, 2007 (KR) ........................ 10-2007-0139980

(51) Int. Cl.
*H01L 21/8242* (2006.01)
(52) U.S. Cl. ...................................... 438/243; 257/331

(58) Field of Classification Search .................. 357/330, 357/331; 257/330, 331; 438/243, 272
See application file for complete search history.

(56) References Cited

U.S. PATENT DOCUMENTS
2006/0281249 A1* 12/2006 Yilmaz et al. ............... 438/243

* cited by examiner

*Primary Examiner*—Thomas L Dickey
(74) *Attorney, Agent, or Firm*—Sherr & Vaughn, PLLC

(57) ABSTRACT

A trench gate MOSFET and a fabrication method thereof includes forming a first epitaxial layer over a semiconductor substrate, and then forming a second epitaxial layer formed over the first epitaxial layer, and then forming a body region over the second conductive type second epitaxial layer, and then forming a circular cross-section in a portion of the body region by performing an ion implantation process on the body region such that a bottom area thereof has a circular cross-section.

4 Claims, 3 Drawing Sheets

METHOD OF FABRICATING A TRENCH GATE MOSFET FOR MAXIMIZING BREAKDOWN VOLTAGE

The present application claims priority under 35 U.S.C. §119 to Korean Patent Application No. 10-2007-0139980 (filed on Dec. 28, 2007), which is hereby incorporated by reference in its entirety.

BACKGROUND

With a trend toward reduction in a size of cell designs to maximize integration of a semiconductor device, a space between cell pitches is also reduced. This reduction requires linear reduction in contact size. However, the reduced contact size increases contact resistance, thereby causing the semiconductor device to have a negative factor which increases power consumption and slows operating speed of the device.

In this regard, there is a need to reduce contact resistance to maximize characteristics of the device without deteriorating the advantages of the designs. Using a trench gate MOSFET is one technology that may overcome the minimized contact size by etching the silicon substrate below the surface of the silicon substrate to form the contact. This increases a total contact area that contacts silicon regions and minimizes the resistance increase.

Figure 1:
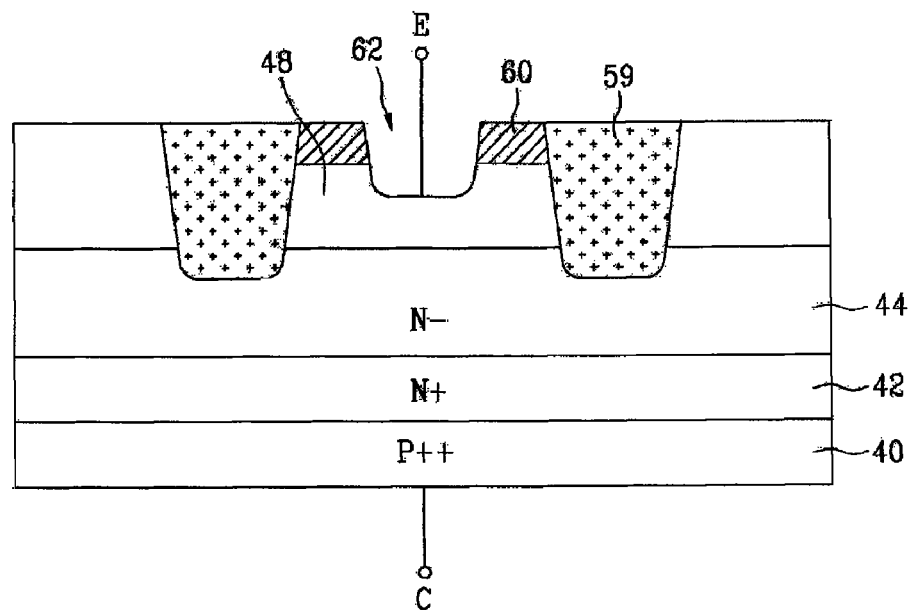

FIG. 1 is a sectional view illustrating a trench gate MOSFET that includes a highly concentrated (P++) semiconductor substrate 40, an N+ epitaxial layer 42 formed on and/or over the substrate 40, and an N− epitaxial layer 44 formed on and/or over the N+ epitaxial layer 42. The transistor further includes a plurality of P− body regions 48 formed on and/or over the N− epitaxial layer 44. The P− body regions 48 are electrically separated from each other by trench separation regions. The trench separation regions are formed by gates 59 filled with doped polysilicon. The transistor may further include an N0 epitaxial layer which is more highly concentrated than the N− epitaxial layer 44, underneath the P− body region 48 to reduce forward voltage drop of a device, N+ emitter regions 60 formed in the uppermost surface of the P− body region 48, and a contact hole 62 formed in the uppermost surface of the P− body region 48 between the N+ emitter regions 60. The transistor also includes an emitter electrode E and a collector electrode C, respectively.

Such a trench gate MOSFET has a problem of deteriorating BV characteristics of a device caused by decrease in a thickness between the bottom of P− body region and the N− epitaxial layer.

SUMMARY

Embodiments relate to a MOSFET such as a trench gate MOSFET and a method for fabricating the same that maximizes breakdown voltage (BV) of a transistor.

In accordance with embodiments, a trench gate MOSFET may include at least one of the following: a second conductive type first epitaxial layer formed on and/or over a first conductive type semiconductor substrate, a second conductive type second epitaxial layer formed on and/or over the second conductive type first epitaxial layer, a first conductive type body region formed on and/or over the second conductive type second epitaxial layer, a plurality of trenches formed spaced apart a predetermined distance from each other in the first conductive type body region, a plurality of gates buried in the trenches, a plurality of second conductive type emitter regions formed in the upper surface of the first conductive type body region, and a contact hole formed in the upper surface of the first conductive type body region between the adjacent second conductive type emitter regions. In accordance with embodiments, the first conductive type body region is formed such that the bottom surface of the contact hole contacting the second conductive type second epitaxial layer has a circular cross-section.

In accordance with embodiments, a method for fabricating a trench gate MOSFET may include at least one of the following: forming a second conductive type first epitaxial layer and a second conductive type second epitaxial layer on and/or over a first conductive type semiconductor substrate, forming a first conductive type body region on and/or over the second conductive type second epitaxial layer, forming a plurality of trenches spaced apart in the first conductive body region by a predetermined distance, forming a plurality of gates by burying the trenches with a conductive layer, forming a second conductive type emitter region in the upper surface of the first conductive type body region, forming a contact hole in the upper surface of the first conductive type body region in the center of the second conductive type emitter regions, and forming the bottom surface of the contact hole contacting the second conductive type second epitaxial layer into a circular cross-section.

In accordance with embodiments, device may include at least one of the following: a first conductive type semiconductor substrate; a second conductive type first epitaxial layer formed over the first conductive type semiconductor substrate; a second conductive type second epitaxial layer formed over the second conductive type first epitaxial layer; a first conductive type body region formed over the second conductive type second epitaxial layer; a plurality of trenches formed spaced apart in the first conductive type body region; a gate buried in each one of the trenches; a plurality of second conductive type emitter regions formed in the first conductive type body region; and a contact hole formed in the first conductive type body region between adjacent second conductive type emitter regions such that a bottom portion of the first conductive type body region formed under the contact hole and contacting the second conductive type second epitaxial layer has a circular cross-section.

In accordance with embodiments, a method may include at least one of the following: forming a first epitaxial layer over a semiconductor substrate; and then forming a second epitaxial layer formed over the first epitaxial layer; and then forming a body region over the second conductive type second epitaxial layer; and then forming a circular cross-section in a portion of the body region by performing an ion implantation process on the body region such that a bottom area thereof has a circular cross-section; and then forming gate structures spaced apart extending through the body region and partially in the second epitaxial layer; and then forming emitter regions in the first conductive type body region; and then forming a contact hole in the body region between the second conductive type emitter regions and above a portion of the body region having the circular cross-section.

In accordance with embodiments, a method may include at least one of the following: sequentially forming a second conductive type first epitaxial layer and a second conductive type second epitaxial layer over a first conductive type semiconductor substrate; and then forming a first conductive type body region over the second conductive type second epitaxial layer; and then injecting first conductive type impurities in the first conductive type body region in order that a bottom area thereof has a circular cross-section; and then forming a plurality of trenches spaced apart in the first conductive body region; and then forming a gate in a respective one of the trenches; and then forming second conductive type emitter regions in the first conductive type body region; and then forming a contact hole at the upper surface of the first conductive type body region between adjacent ones of the second conductive type emitter regions.

In accordance with embodiments, the trench gate MOSFET and the method for fabricating the same forms the P− body region of the contact hole area into a circular cross-section by injecting a P type impurity once more, so that a space between the contact hole and the P– body region on the N– epitaxial layer maintains a predetermined thickness. As a result, BV characteristics of a MOSFET can be maximized.

DRAWINGS

FIG. 1 illustrates a trench gate MOSFET.

Figure 2:
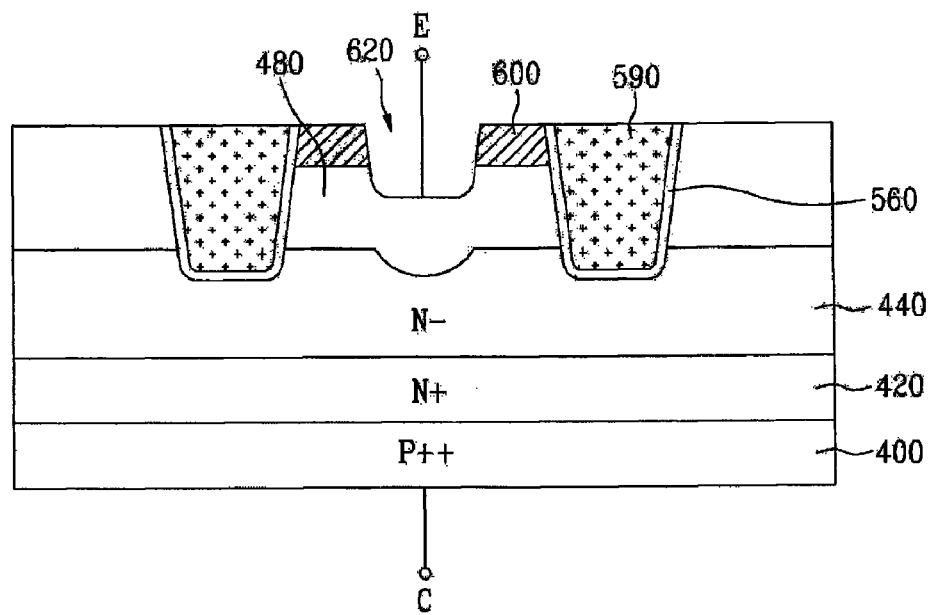

Example FIGS. 2 to 3 illustrate a trench gate MOSFET and a method for fabricating a trench gate MOSFET in accordance with embodiments.

DESCRIPTION

As shown in example FIG. 2, a trench gate MOSFET in accordance with embodiments may include an N+ epitaxial layer 420 formed on and/or over a highly concentrated (P++) semiconductor substrate 400, and an N– epitaxial layer 440 formed thereon and/or thereover. A plurality of P– body regions 480 are formed on and/or over the N– epitaxial layer 440 such that they are electrically separated by a plurality of trench separation regions. Each trench separation region includes a gate 590 made of doped polysilicon and a gate oxide layer 560 made of an oxide film which surrounds the gate. A plurality of N+ emitter regions 600 are formed in the upper surface of the P– body region 480, and a contact hole 620 is formed in the upper surface of the P– body region 480 between adjacent emitter regions 600. Additionally, an emitter electrode E and a collector electrode C are formed, respectively. The P– body region 480 is formed such that the bottom surface area of the contact hole 620 contacting the N– epitaxial layer 440 has a circular cross-section. Due to a portion of the P– body region 480 having a circular cross-section, the P– body region 480 between the bottom area of the contact hole 620 and the N– epitaxial layer 440 can maintain a predetermined thickness. As a result, BV characteristics of the MOSFET can be maximized.

Example FIGS. 3A to 3D are sectional views illustrating a method for fabricating a trench gate MOSFET in accordance with embodiments. As shown in example FIG. 3A, an N+ epitaxial layer 420 and an N– epitaxial layer 440 are formed on a highly concentrated (P++) semiconductor substrate 400 using an epitaxial growth method.

Figure 3A:
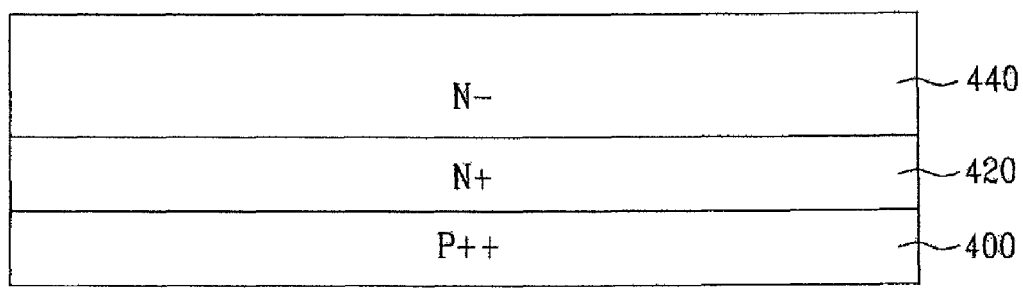
Figure 3B:
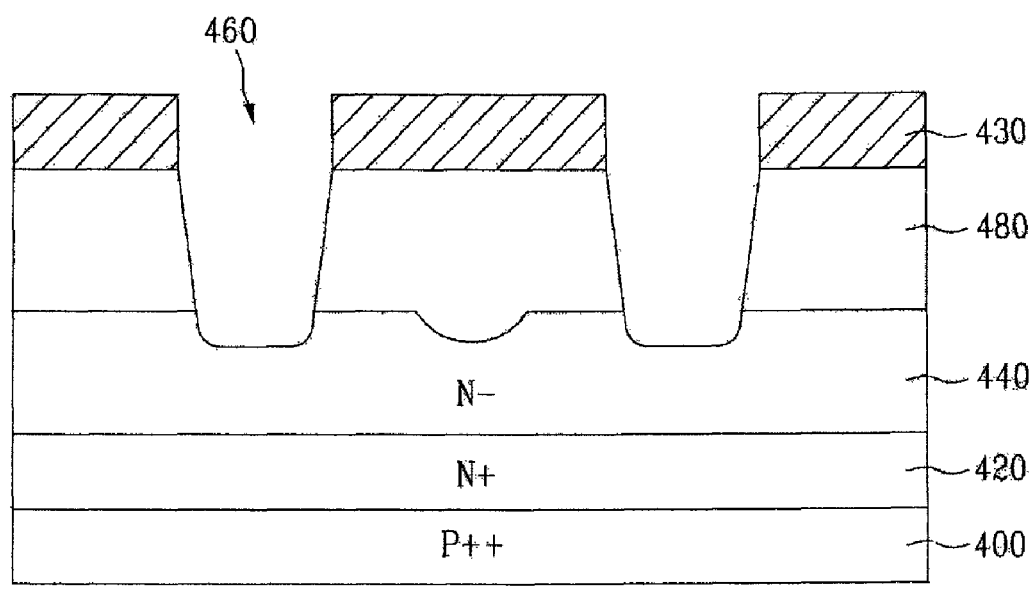

As shown in example FIG. 3B, P– impurities are ion injected into the N– epitaxial layer 440. The P– impurities are then activated to form a P– body region 480. Then, P– impurities are injected once more into an area of the P– body region 480 where a contact hole 620 is to be formed in the subsequent process so that the bottom contact hole 620 area of the P– body region 480 is formed into a circular cross-section. Then, a mask layer 430 for protecting the semiconductor substrate during an etching process to form trenches is formed by depositing or growing at least one of a nitride layer and an oxide layer on and/or over the N– epitaxial layer 440 formed with the P– body region 480. Next, the mask layer 430 is patterned using an etching process to expose the surface areas of N– epitaxial layer 440 where trenches are to be formed. The exposed areas are subjected to anisotropic etching to form a plurality of trenches 460. The inner wall of the trenches may be thinly etched, and a sacrificial oxide layer may be grown on and/or over the inner wall to repair damage generated on the substrate during the anisotropic etching carried out to form the trenches 460.

Figure 3C:
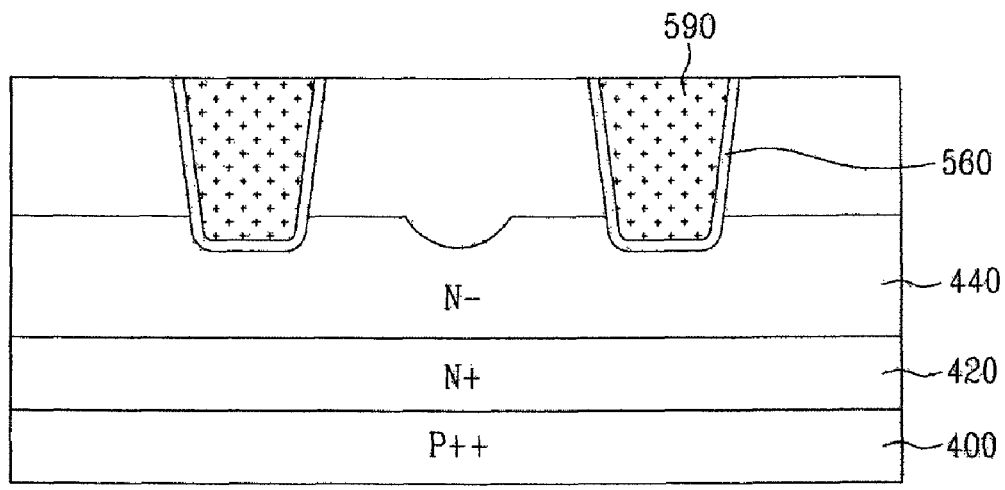

As shown in example FIG. 3C, a gate oxide layer 560 is formed on and/or over the surface of the trenches 460. Then, a conductive layer, for example, a polysilicon layer doped with highly concentrated impurities, is deposited on and/or over the gate oxide layer 560. The polysilicon layer is subjected to etchback to form a plurality of gates buried in the trenches.

Figure 3D:
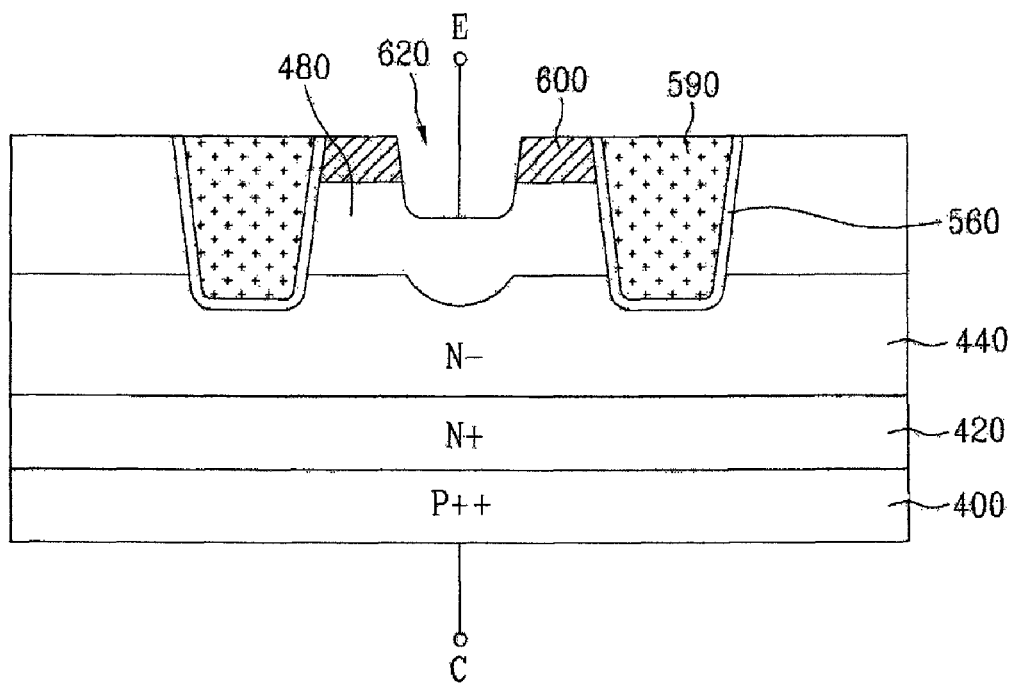

As shown in example FIG. 3D, photolithography is carried out to define a region where an emitter region is to be formed. To the defined region, N-type impurities are ion injected to form an N+ emitter region 600. Thereafter, the center of the emitter region 600 is etched to form a contact hole 620. In the above description, it was disclosed that the P– impurities are ion injected into the surface of the N– epitaxial layer 440, and the injected impurities are activated to form the P– body region 480. Further, it was disclosed that the P– impurities are ion injected a second time into the area of the P– body region 480 where the contact hole 620 is to be formed in the subsequent process, so that the bottom contact hole 620 area of the P– body region 480 is formed having a circular cross-section. However, the additional ion injection of P– impurities can be carried out on the contact hole 620 area after forming the contact hole 620, so as to form the bottom contact hole 620 area of the P– body region 480 into a circular cross-section. Finally, an emitter electrode E and a collector electrode are formed, respectively.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:
    forming a second conductive type first epitaxial layer and a second conductive type second epitaxial layer over a first conductive type semiconductor substrate; and then
    forming a first conductive type body region over the second conductive type second epitaxial layer; and then
    injecting first conductive type impurities in the first conductive type body region in order that a bottom area thereof has a circular cross-section; and then
    forming a plurality of trenches spaced apart in the first conductive body region; and then
    forming a gate oxide layer in a respective one of the trenches; and then
    forming a gate in a respective one of the trenches; and then
    forming second conductive type emitter regions in the first conductive type body region; and then
    forming a contact hole at the upper surface of the first conductive type body region between adjacent ones of the second conductive type emitter regions,
    wherein the first conductive type body region between the bottom area of the contact hole and the second conductive type second epitaxial layer is formed to maintain a predetermined thickness.

2. The method of claim 1, further comprising, after forming the plurality of trenches and before forming the gate:
    etching the walls the trenches.

3. The method of claim 1, further comprising, after etching the walls of the trenches:
    forming a sacrificial oxide layer over the walls of the trench.

4. The method of claim 1, wherein the bottom area of the first conductive type body region corresponds spatially to the bottom area of the contact hole.

* * * * *